US010873028B2

(12) United States Patent
Kim et al.

(10) Patent No.: US 10,873,028 B2
(45) Date of Patent: Dec. 22, 2020

(54) DEPOSITION MASK AND MASK ASSEMBLY INCLUDING THE SAME

(71) Applicant: Samsung Display Co., Ltd., Yongin-Si (KR)

(72) Inventors: Sanghoon Kim, Gyeonggi-do (KR); Seungjin Lee, Suwon-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/397,948

(22) Filed: Apr. 29, 2019

(65) Prior Publication Data

US 2019/0378983 A1    Dec. 12, 2019

(30) Foreign Application Priority Data

Jun. 12, 2018  (KR) .................. 10-2018-0067675

(51) Int. Cl.
| | |
|---|---|
| *H01L 51/00* | (2006.01) |
| *H01L 27/12* | (2006.01) |
| *H01L 51/56* | (2006.01) |
| *C23C 14/04* | (2006.01) |

(52) U.S. Cl.
CPC ........ *H01L 51/0011* (2013.01); *C23C 14/042* (2013.01); *H01L 27/1288* (2013.01); *H01L 51/56* (2013.01)

(58) Field of Classification Search
CPC . H01L 51/0011; H01L 27/1288; H01L 51/56; C23C 14/042
See application file for complete search history.

(56) References Cited

U.S. PATENT DOCUMENTS

| | | | |
|---|---|---|---|
| 10,083,997 B2 | 9/2018 | Kim | |
| 2008/0018236 A1* | 1/2008 | Arai | ...................... C23C 14/042 313/504 |
| 2011/0146573 A1* | 6/2011 | Park | ...................... C23C 14/042 118/712 |
| 2016/0263607 A1 | 9/2016 | Wang et al. | |
| 2018/0065143 A1 | 3/2018 | Baek et al. | |
| 2018/0138408 A1* | 5/2018 | Lassiter | .............. H01L 51/0011 |
| 2019/0378984 A1* | 12/2019 | Nakamura | .......... H01L 51/0023 |

FOREIGN PATENT DOCUMENTS

| | | |
|---|---|---|
| CN | 204803392 U | 11/2015 |
| JP | 2009221535 A | 10/2009 |
| KR | 10-2015-0096590 A | 8/2015 |
| KR | 10-2017-0102143 A | 9/2017 |

OTHER PUBLICATIONS

Extended European Search Report, Application No. 19177420.7, dated Nov. 14, 2019 , 8 pages.

* cited by examiner

*Primary Examiner* — Feifei Yeung Lopez
(74) *Attorney, Agent, or Firm* — Innovation Counsel LLP

(57) ABSTRACT

A deposition mask may include a patterning region provided with a pattern portion, and a plurality of bonding regions provided near opposite ends of the patterning region in a first direction. The pattern portion may include a first pattern portion, in which first pattern holes are defined, and a plurality of second pattern portions, in which second pattern holes are defined, and which are located between opposite ends of the first pattern portion and the bonding regions in the first direction. A minimum distance between adjacent ones of the second pattern holes may be larger than a minimum distance between adjacent ones of the first pattern holes.

30 Claims, 14 Drawing Sheets

DEPOSITION MASK AND MASK ASSEMBLY INCLUDING THE SAME

CROSS-REFERENCE TO RELATED APPLICATIONS

This U.S. non-provisional patent application claims priority under 35 U.S.C. § 119 to Korean Patent Application No. 10-2018-0067675, filed on Jun. 12, 2018, in the Korean Intellectual Property Office, the entire contents of which are hereby incorporated by reference.

BACKGROUND

The present disclosure relates to a deposition mask and a mask assembly including the same, and in particular, to a deposition mask, which is configured to improve accuracy and uniformity in a deposition process, and a mask assembly including the same.

An organic light emitting display device, which is one of self-luminescent display devices, has technical advantages, such as wide viewing angle, good contrast, and fast response speed, and thus, is emerging as a next-generation display device. The organic light emitting display device include two opposite electrodes and an intermediate layer (e.g., at least one light emitting layer) interposed between the electrodes. Various methods including a deposition method can be used to form the intermediate layer. In the case of the deposition method, a deposition mask (e.g., a fine metal mask (FMM)) is placed to be in close contact with a substrate. A deposition material is supplied onto the substrate through the deposition mask to form a thin deposition film with desired patterns. Here, the deposition mask is provided to have openings whose shapes are the same as those of the patterns of the thin deposition film to be formed on the substrate.

SUMMARY

An embodiment of the inventive concept provides a deposition mask, which is configured to improve accuracy and uniformity in a deposition process.

According to an embodiment of the inventive concept, a deposition mask may include a patterning region provided with a pattern portion, and a plurality of bonding regions provided near opposite ends of the patterning region in a first direction. The pattern portion may include a first pattern portion, in which first pattern holes are defined, and a plurality of second pattern portions, in which second pattern holes are defined, and which are located between opposite ends of the first pattern portion and the bonding regions in the first direction. A second distance, which is a minimum distance between adjacent ones of the second pattern holes, may be larger than a first distance, which is a minimum distance between adjacent ones of the first pattern holes.

In an embodiment, a size of each of the first pattern holes may be substantially equal to a size of each of the second pattern holes.

In an embodiment, the second distance may be larger than or equal to about 20 μm.

In an embodiment, each of the second pattern portions may include a first portion, which is provided adjacent to a bonding region of the bonding regions, and in which the second pattern holes are defined, and a second portion, which is provided between the first portion and the first pattern portion, and in which the first pattern holes are defined.

In an embodiment, in the first portion, the second pattern holes may be defined to form at least two rows.

In an embodiment, each of the second pattern portions may further include a third portion, which is provided between the first portion and the bonding regions, and in which third pattern holes are defined. A third distance, which is a minimum distance between adjacent ones of the third pattern holes, may be larger than the second distance.

In an embodiment, the first pattern portion may include a plurality of deposition parts, which are spaced apart from each other in the first direction, and in which the first pattern holes are defined, and at least one blocking part provided between the deposition parts.

In an embodiment, an opening ratio of the blocking part may be smaller than an opening ratio of each of the deposition parts.

In an embodiment, the opening ratio of the blocking part may be 0.

In an embodiment, the blocking part may be provided to have a plurality of fourth pattern holes defined therein. A size of each of the fourth pattern holes may be substantially equal to a size of each of the first pattern holes.

In an embodiment, a minimum distance between adjacent ones of the fourth pattern holes may be larger than or equal to the second distance.

In an embodiment, the blocking part may be provided to have a plurality of fourth pattern holes defined therein. A size of each of the fourth pattern holes may be less than a size of each of the first pattern holes In an embodiment, a minimum distance between adjacent ones of the fourth pattern holes may be substantially equal to the first distance.

In an embodiment, an opening ratio of the blocking part may be substantially equal to an opening ratio of each of the deposition parts.

In an embodiment, a width of the blocking part in the first direction may be different than a width of the second pattern portions in the first direction.

In an embodiment, a largest distance between the first pattern holes may be substantially equal to the second distance.

In an embodiment, the deposition mask may further include cutting parts, which are provided adjacent to opposite ends of the bonding regions in the first direction. Each of the cutting parts may include a dummy pattern portion, in which dummy pattern holes are defined, and the dummy pattern holes may be defined to have substantially a same arrangement structure as that of the first pattern holes.

In an embodiment, each of the cutting parts may be provided to have a clamping recess, which is recessed inward from an outer side of the cutting parts in the first direction.

According to an embodiment of the inventive concept, a mask assembly may include a frame set, and a plurality of deposition masks disposed on the frame set, each of the plurality of deposition masks extending in a first direction. The frame set may include a support frame, and a plurality of support bars, which extend in a second direction crossing the first direction and are arranged in the first direction. Opposite ends of each of the plurality of support bars in the second direction may be coupled to the support frame. Each of the deposition masks may include a plurality of bonding regions, which are spaced apart from each other in the first direction and are fixed to the support frame, and a patterning region, which is provided between the bonding regions and is provided with a pattern portion. The pattern portion may include a first pattern portion, which is provided to overlap a center of the pattern portion, and in which a plurality of first pattern holes are defined, and a plurality of second pattern portions, which are provided between opposite ends of the first pattern portion and the bonding regions in the first direction. A plurality of second pattern holes may be defined in at least a region of each of the plurality of second pattern portions. A minimum distance between adjacent ones of the second pattern holes may be larger than a minimum distance between adjacent ones of the first pattern holes.

In an embodiment, a size of each of the first pattern holes may be substantially equal to a size of each of the second pattern holes.

In an embodiment, the support bars include at least one first support bar arranged in the first direction and overlapping a portion of the first pattern portion, and second support bars, which are the outermost ones of the support bars in the first direction and are overlapping the second pattern portions of each of the deposition masks.

In an embodiment, the first pattern portion includes: a plurality of deposition parts, which are spaced apart from each other in the first direction, and in which the first pattern holes are defined, and at least one blocking part, which is provided between the deposition parts and is overlapping the first support bar.

In an embodiment, a width of each of the second support bars in the first direction may be different than a width of each of the first support bars in the first direction.

In an embodiment, an opening ratio of the bonding regions may be 0.

In an embodiment, each of inner side portions of the support frame, which are opposite to each other in the second direction, may be provided to have a plurality of coupling pockets arranged in the first direction. Opposite ends of the support bars may be disposed in the plurality of coupling pockets.

In an embodiment, the minimum distance between adjacent ones of the second pattern holes may be larger than or equal to about 20 µm.

In an embodiment, in the second pattern portions, the second pattern holes may form at least two rows.

According to an embodiment of the inventive concept, a deposition mask may include a patterning region, in which a plurality of pattern holes are defined, and a plurality of bonding regions provided near opposite ends of the patterning region in a first direction. A minimum distance between adjacent ones of the pattern holes, which are defined in portions of the patterning region adjacent to the bonding regions, may be larger than a minimum distance between adjacent ones of the pattern holes, which are defined in another portion of the patterning region other than the portions.

According to an embodiment of the inventive concept, a deposition mask may include a patterning region including a pattern portion, and a plurality of bonding regions provided near opposite ends of the patterning region in a first direction. The pattern portion may include a first pattern portion, in which pattern holes in a first arrangement structure are defined, and a plurality of second pattern portions, pattern holes in a second arrangement structure being defined in at least a portion of the plurality of second pattern portions. A minimum distance between the pattern holes in the second arrangement structure may be larger than a minimum distance between the pattern holes in the first arrangement structure.

In an embodiment, the minimum distance between the pattern holes in the second arrangement structure may be larger than or equal to about 20 µm.

In an embodiment, a diameter of each of the pattern holes in the first and second arrangement structures ranges from about 17 µm to about 22 µm.

In an embodiment, the pattern holes in the second arrangement structure may form at least two rows.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
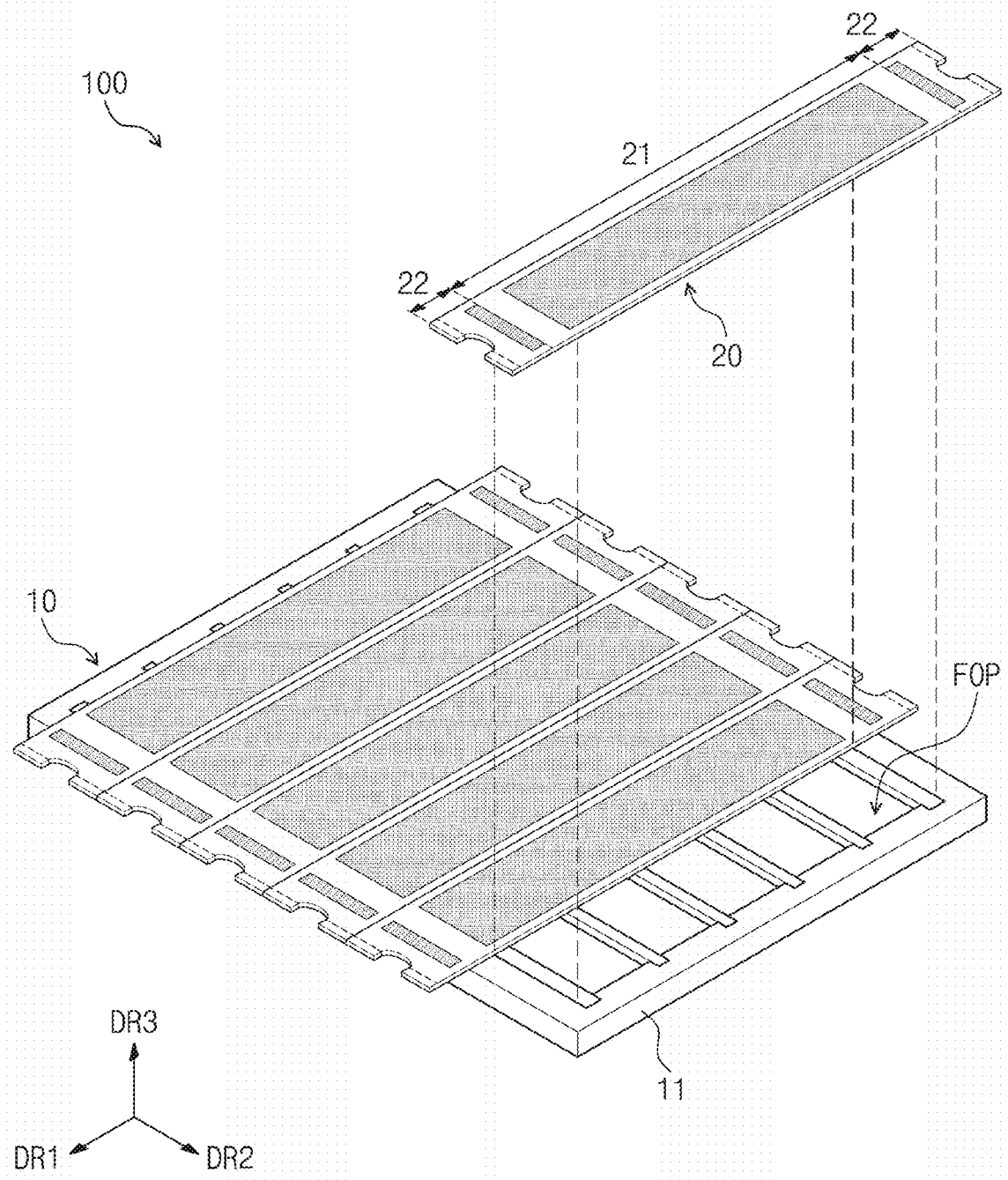
FIG. 1 is a perspective view illustrating a mask assembly according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
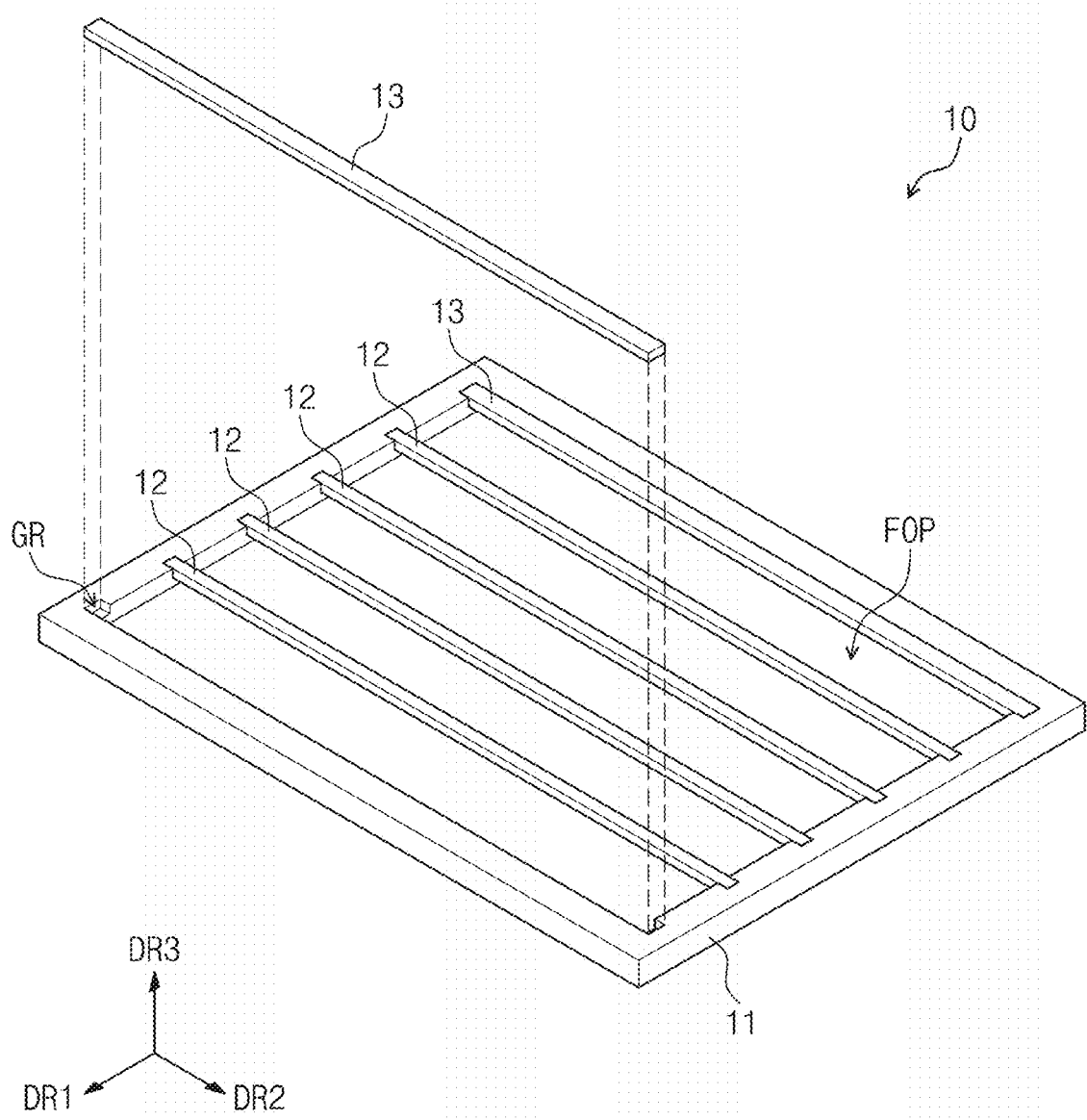
FIG. 2 is a perspective view illustrating a support frame set shown in FIG. 1.
Figure 3:
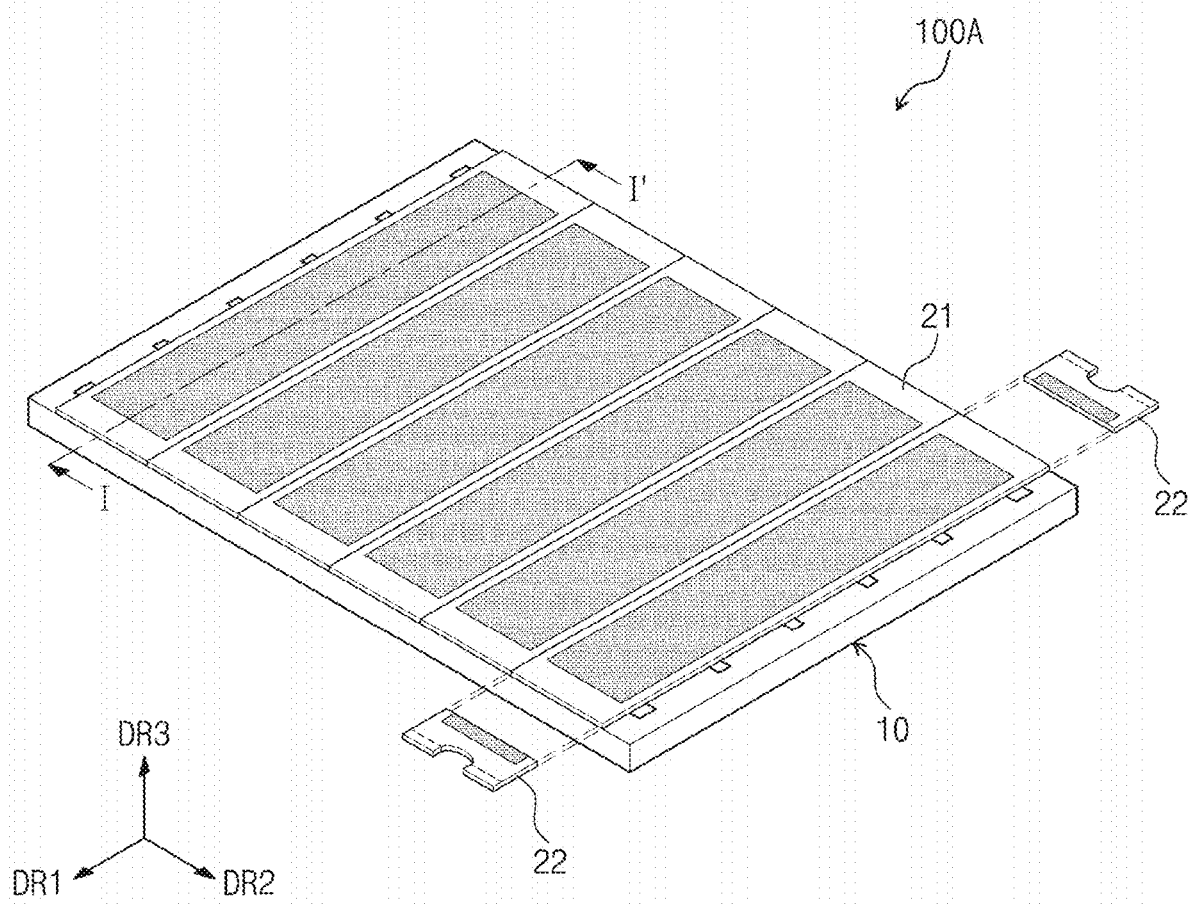
FIG. 3 is a perspective view illustrating a mask assembly, in which a cutting part is cut.

FIG. 1 is a perspective view illustrating a mask assembly 100 according to an embodiment of the inventive concept. FIG. 2 is a perspective view illustrating a support frame set 10 shown in FIG. 1. FIG. 3 is a perspective view illustrating a mask assembly 100A, in which a cutting part 22 is cut.

Referring to FIGS. 1 to 3, the mask assembly 100 according to an embodiment of the inventive concept may be used for a process of depositing an organic material on a target substrate SUB, which will be described with reference to FIG. 4. For example, the mask assembly 100 may be used for an organic material deposition process, which is performed to fabricate an organic light emitting device (not shown).

In an embodiment, the mask assembly 100 may include the frame set 10 and a plurality of deposition masks 20.

The mask assembly 100 may include a support frame 11 and plurality of support bars 12 and 13. The support frame 11 may have a rectangular or tetragonal shape. The support frame 11 may have a frame opening FOP in a central region thereof.

As shown in FIGS. 1 to 3, when viewed in a plan view, the support frame 11 may have a rectangular shape, whose short sides extend in a first direction DR1 and whose long sides extend in a second direction DR2 crossing the first direction DR1. However, the inventive concept is not limited to a particular shape of the support frame 11. A length of the support frame 11 in the first or second direction DR1 or DR2 may be changed depending on the size or the number of the deposition masks 20 to be described in more detail below.

Each of the support bars 12 and 13 may be shaped like a rod. For example, each of the support bars 12 and 13 may have a shape elongated in the second direction DR2. The support bars 12 and 13 may be arranged in the first direction DR1. The support bars 12 and 13 may be placed on an internal region of the support frame 11 to divide the frame opening FOP into a plurality of regions. The support bars 12 and 13 may be used to support the deposition masks 20 to be described below.

The support bars 12 and 13 may include at least one first support bar 12 and a plurality of second support bars 13. For example, as shown in FIGS. 1 to 3, the mask assembly 100 may be configured to include a plurality of the first support bars 12.

The plurality of the first support bars 12 may be arranged to be spaced apart from each other by a predetermined distance in the first direction DR1. A pair of the second support bars 13 may be the outermost bars of the support bars 12 and 13, which are located at the outermost regions of the mask assembly 100 in the first direction DR1. In other words, the plurality of the first support bars 12 may be arranged between the pair of the second support bars 13.

In the present embodiments, a distance between an adjacent pair of the support bars 12 and 13 may be constant. However, the inventive concept is not limited to this example. For example, the distance between the support bars 12 and 13 may be changed in consideration of a size or shape of a deposition region of the target substrate SUB (e.g., see FIG. 4), on which a deposition process will be performed.

In the present embodiments, when measured in the first direction DR1, a width of the first support bar 12 may be different than a width of the second support bar 13. FIGS. 1 to 3 illustrate an example in which the width in the first direction DR1 of the second support bar 13 is larger than the width in the first direction DR1 of the first support bar 12. However, the inventive concept is not limited to specific values for the widths in the first direction DR1 of the first and second support bars 12 and 13. The widths in the first direction DR1 of the first and second support bars 12 and 13 may be changed in consideration of a size or shape of the deposition region of the target substrate SUB (e.g., see FIG. 4), on which a deposition process will be performed.

The support frame 11 may include inner side portions, which are provided adjacent to the frame opening FOP. In the present embodiments, a plurality of coupling pockets GR may be defined in some of the inner side portions, which are located to face each other in the second direction DR2. The coupling pockets GR may be provided in pairs, and each pair of the coupling pockets GR may be provided to face each other in the second direction DR2. The pairs of the coupling pockets GR may be arranged in the first direction DR1.

Each pair of the coupling pockets GR may be associated with a corresponding one of the support bars 12 and 13. For example, opposite end portions of each of the support bars 12 and 13 may be coupled to a corresponding pair of the coupling pocket GR, and thus, each of the support bars 12 and 13 may be fastened to the support frame 11.

In the present embodiments, the second support bars 13 may be in contact with inner side portions of the support frame 11, which are opposite to each other in the first direction DR1. In other words, a gap region may not be formed between the second support bars 13 and the inner side portions of the support frame 11, which are opposite to each other in the first direction DR1.

In the present embodiments, the support bars 12 and 13 may be configured to be inserted into the coupling pockets GR of the support frame 11, but the inventive concept is not limited to a method that is used to fasten the support bars 12 and 13 to the support frame 11.

The deposition masks 20 may be mounted on the frame set 10. In the present embodiments, each of the support bars 12 and 13 of the frame set 10 may be provided to have a top surface that is substantially coplanar with a top surface of the support frame 11. In this case, the deposition masks 20 may be more stably mounted on the frame set 10.

Each of the deposition masks 20 may extend in the first direction DR1. The deposition masks 20 may be arranged in the second direction DR2.

Each of the deposition masks 20 may include a mask unit 21 and a plurality of the cutting parts 22.

The mask unit 21 may extend in the first direction DR1. The mask unit 21 may be a portion of the deposition mask 20 that is substantially supported by the frame set 10. In other words, two end portions of the mask unit 21, which are opposite to each other in the first direction DR1, may be partially overlapping the long sides of the support frame 11. The end portions of the mask unit 21, which are partially overlapping the long sides of the support frame 11, may be bonded to the long sides of the support frame 11 through a bonding process such as a welding process.

The cutting parts 22 may be placed adjacent to the two end portions of the mask unit 21, which are opposite to each other in the first direction DR1. For example, the cutting parts 22 may be connected to the two end portions of the mask unit 21, which are opposite to each other in the first direction DR1. In other words, the mask unit 21 may be placed between a pair of the cutting parts 22. The cutting parts 22 may not be in contact with the frame set 10.

According to the present embodiments, each of the deposition masks 20 may be supported by a fastening member (not shown), when each of the deposition masks 20 is not yet mounted on the frame set 10. The fastening member may be, for example, a clamp. Each of the cutting parts 22, which are provided at opposite end portion of each of the deposition masks 20, may be fastened by the fastening member, and as a result, the deposition mask 20 may be stably supported by the fastening member. Furthermore, the fastening member may be configured to fasten each of the cutting parts 22 and to exert a tensile force on the deposition mask 20. The tensile force may be exerted on the deposition mask 20 in the first direction DR1.

In the present embodiments, the cutting parts 22 may be cut, after the process of bonding the mask unit 21 to the support frame 11. FIG. 3 illustrates a mask assembly 100A, from which the cutting parts 22 are detached. In other words, if the cutting process is finished, the mask assembly 100A may include only the frame set 10 and the mask unit 21. The deposition mask 20 will be described in more detail with reference to FIGS. 5 to 8.

Figure 4:
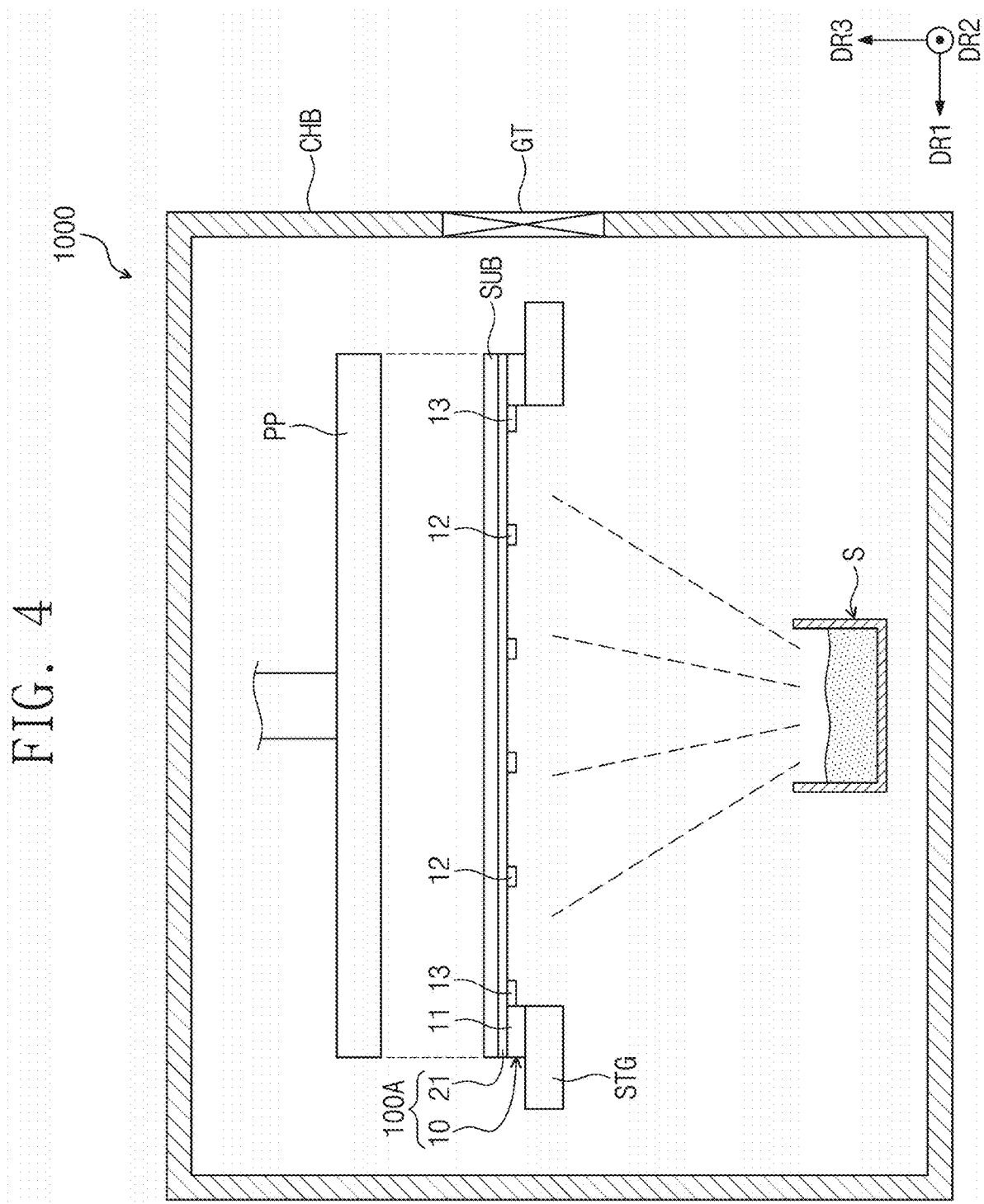
FIG. 4 is a sectional view schematically illustrating a deposition system according to an embodiment of the inventive concept.

FIG. 4 is a sectional view schematically illustrating a deposition system 1000 according to an embodiment of the inventive concept.

Referring to FIG. 4 in conjunction with FIG. 3, the mask assembly 100A described above may be used for a process of depositing an organic material.

For example, the deposition system 1000 according to an embodiment of the inventive concept may include a chamber CHB, a deposition source S, a stage STG, and a moving plate PP, in addition to the mask assembly 100A. The deposition source S, the stage STG, the moving plate PP, and the mask assembly 100A may be placed in the chamber CHB.

The chamber CHB may be configured to provide an isolated space. The chamber CHB may have at least one gate GT. The isolated space of the chamber CHB may be selectively connected to the outside through the gate GT. The mask assembly 100A and the target substrate SUB may enter or exit the chamber CHB through the gate GT.

The deposition source S may be provided in a lower region of the chamber CHB. The deposition source S may include a deposition material. Here, the deposition material may include at least one of inorganic, organic, or metallic materials, which can be sublimated or evaporated. The description that follows will refer to an example in which the deposition source S is prepared to include an organic material, which is used to fabricate an organic light emitting device (not shown).

The stage STG may be placed over the deposition source S. The mask assembly 100A may be mounted on the stage STG. The mask assembly 100A may be provided to face the deposition source S. A vertical section of the mask assembly 100A taken along line I-I' of FIG. 3 is illustrated in FIG. 4. The stage STG may overlap the support frame 11 of the mask assembly 100A and may be used to support the mask assembly 100A. The stage STG may not overlap the frame opening FOP (e.g., see FIGS. 1 and 2) that is defined in the support frame 11. In other words, the stage STG may be located outside a traveling path of a deposition material to be supplied from the deposition source S to the target substrate SUB.

The target substrate SUB may be mounted on the mask assembly 100A. Patterns, which are provided in the mask unit 21 of the mask assembly 100A, may be used to selectively deposit an organic material on desired regions of the target substrate SUB.

In the present embodiments, the moving plate PP may be configured to align the target substrate SUB to the mask assembly 100A. For example, the moving plate PP may be configured to move the target substrate SUB using an electric or magnetic force. The moving plate PP may be configured to be movable in a vertical or horizontal direction.

In an embodiment, the moving plate PP may be used to fasten the target substrate SUB to a top surface of the mask assembly 100A. Since the target substrate SUB is fastened to the mask assembly 100A by the moving plate PP, it may be possible to improve accuracy of the deposition process.

In the present embodiments, the deposition material in the deposition source S may be sublimated or evaporated, and the sublimated or evaporated deposition material may be supplied onto the target substrate SUB through the mask unit 21 of the mask assembly 100A. The deposition material may not be supplied onto a region of the target substrate SUB that is veiled, sometimes called covered, by the mask unit 21.

Figure 5:
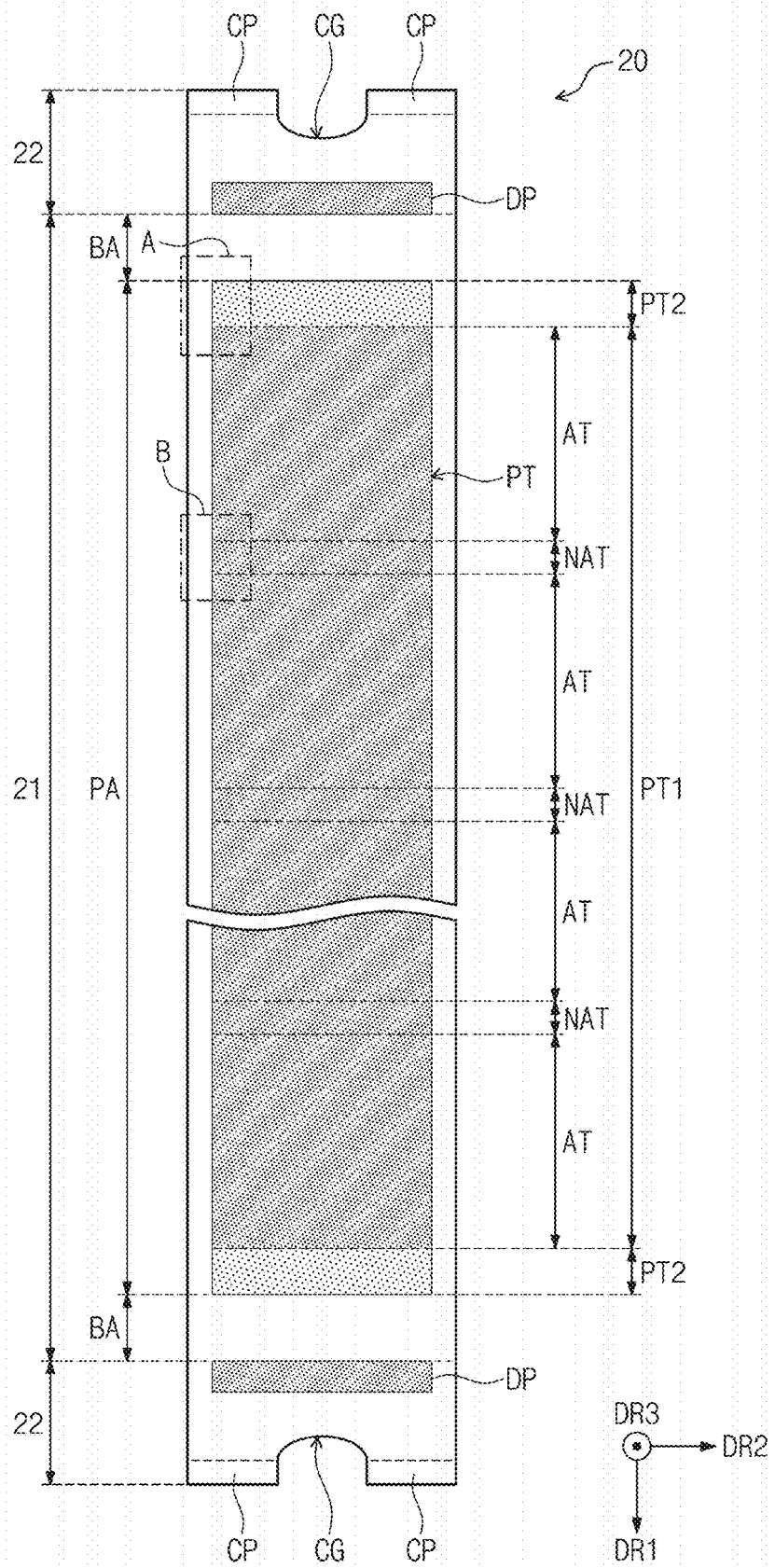
FIG. 5 is a plan view of a deposition mask.

FIG. 5 is a plan view of the deposition mask 20.

As described above, the deposition mask 20 according to an embodiment of the inventive concept may include the mask unit 21 and a plurality of the cutting parts 22.

Referring to FIG. 5, the mask unit 21 may include a plurality of regions arranged in the first direction DR1. For example, the mask unit 21 may include a patterning region PA, which overlaps a center of the mask unit 21, and a plurality of bonding regions BA. The bonding regions BA may be provided adjacent to two end portions of the patterning region PA, which are opposite to each other in the first direction DR1. For example, the bonding regions BA may be connected to the two end portions of the patterning region PA, which are opposite to each other in the first direction DR1.

The patterning region PA may overlap the frame opening FOP of the support frame 11 (e.g., see FIG. 2). A pattern portion PT, in which a plurality of pattern holes are defined, may be provided in the patterning region PA.

Each of the bonding regions BA may overlap the afore-described portion of the long side of the support frame 11. In other words, when measured in the first direction DR1, a width of each of the bonding regions BA may be substantially equal to a width of the long side of the support frame 11. The pattern holes may not be defined in the bonding regions BA, i.e., the bonding regions BA may not have any pattern holes. In other words, an opening ratio of each of the bonding regions BA may be 0.

The pattern portion PT may include a first pattern portion PT1 and a plurality of second pattern portions PT2. In the present embodiments, the pattern holes may be defined in each of the first and second pattern portions PT1 and PT2.

The first pattern portion PT1 may include a plurality of deposition parts AT and at least one blocking part NAT. For example, the first pattern portion PT1 may include N deposition parts AT and (N−1) blocking parts NAT, as shown in FIG. 5.

The deposition parts AT may be spaced apart from each other in the first direction DR1. The target substrate SUB of FIG. 4 may include a plurality of deposition regions, on which the deposition material will be deposited, and the deposition parts AT may correspond to the deposition regions, respectively, of the target substrate SUB. In other words, each of the deposition parts AT may include a region that is exposed by the mask assembly 100A.

Each of the blocking parts NAT may be located between the deposition parts AT. In other words, each of the blocking parts NAT may be provided to separate each of the deposition parts AT from other deposition parts AT adjacent thereto. Each of the blocking parts NAT may include a region, which is veiled by the first support bars 12 of FIGS. 1 and 2. In this case, the deposition material provided during the deposition process may not be deposited on the veiled region of each of the blocking parts NAT.

In the present embodiments, the plurality of pattern holes, which are spaced apart from each other by a predetermined distance, may be arranged in each of the deposition and blocking parts AT and NAT. For example, in each of the deposition and blocking parts AT and NAT, the plurality of pattern holes may be arranged to form a first arrangement structure. Each of the deposition and blocking parts AT and NAT may be provided to have an opening ratio which will be called a first opening ratio. In an example, the pattern holes, which are defined in each of the deposition and blocking parts AT and NAT, will be referred to as first pattern holes. This will be described in more detail with reference to FIGS. 6 to 8.

The second pattern portions PT2 may be provided near opposite end portions of the first pattern portion PT1 in the first direction DR1. Each of the second pattern portions PT2 may be provided between one of the opposite end portions of the first pattern portion PT1 and one of the bonding regions BA. In an embodiment, each of the second pattern portions PT2 may be provided to connect one of the opposite end portions of the first pattern portion PT1 to one of the bonding regions BA. For example, each of the second pattern portions PT2 may be provided to connect the outermost one of the deposition parts AT of the first pattern portion PT1 to one of the bonding regions BA. Each of the second pattern portions PT2 may include a region that is veiled by the second support bars 13 described with reference to FIGS. 1 and 2. Thus, the deposition material provided during the deposition process may not be deposited on the veiled region corresponding to each of the second pattern portions PT2.

In the present embodiments, when measured in the first direction DR1, a width of each of the second pattern portions PT2 may be different than a width of each of the blocking parts NAT. For example, as shown in FIG. 5, the width of each of the second pattern portions PT2 in the first direction DR1 may be larger than the width of each of the blocking parts NAT. However, the inventive concept may not be limited to the widths of the second pattern portions PT2 and the blocking part NAT in the first direction DR1. The widths of the second pattern portions PT2 and the blocking part NAT in the first direction DR1 may be variously changed in consideration of a size or shape of the deposition region of the target substrate SUB (e.g., see FIG. 4), on which the deposition process will be performed.

In the present embodiments, the plurality of pattern holes, which are uniformly spaced apart from each other by a predetermined distance, may be arranged in each of the second pattern portions PT2. In each of the second pattern portions PT2, some of the plurality of pattern holes may be arranged to form a second arrangement structure. At least a portion of each of the second pattern portions PT2 may be provided to have a second opening ratio. In an embodiment, second pattern holes may be defined in each of the second pattern portions PT2. This will be described in more detail with reference to FIGS. 6 to 8.

Each of the cutting parts 22 may be provided near outer end portions of the mask unit 21 in the first direction DR1. In other words, opposite end portions of the mask unit 21 may be connected to the cutting parts 22, respectively.

Each of the cutting parts 22 may include a plurality of clamping portions CP, which are located at the outermost regions in the first direction DR1. The clamping portions CP may be fastened by the afore-described fastening member (not shown).

In the present embodiments, a clamping recess CG may be defined between the clamping portions CP. The clamping recess CG may be provided to have a shape that is recessed inward from an outer side of the deposition mask 20 in the first direction DR1. As shown in FIG. 5, the clamping recess CG may be provided to have a curved arc portion. In this case, it may be possible to prevent or suppress the deposition mask 20 from being deformed or broken by the tensile force exerted on the deposition mask 20.

Each of the cutting parts 22 may further include a dummy pattern portion DP. The dummy pattern portion DP may be provided adjacent to the bonding region BA of the mask unit 21. For example, the dummy pattern portion DP may be connected to the bonding region BA of the mask unit 21. In other words, the dummy pattern portion DP may be provided between the clamping portions CP and the bonding region BA.

In the present embodiments, a plurality of pattern holes may be defined in the dummy pattern portion DP. The inventive concept is not limited to the number, shape, and arrangement structure of the pattern holes defined in the dummy pattern portion DP or an opening ratio of the dummy pattern portion DP. For example, the dummy pattern portion DP may be provided to have the same opening ratio as that of the deposition part AT. In other words, the pattern holes defined in the dummy pattern portion DP may be provided to have the same arrangement structure as that of the first pattern holes (i.e., the first arrangement structure).

The dummy pattern portion DP may be configured to absorb the tensile force exerted on the pattern portion PT by the clamping portions CP. Thus, the dummy pattern portion DP may prevent or suppress the pattern portion PT from being deformed by the tensile force exerted on the deposition mask 20.

In the present embodiments, each of the cutting parts 22 is illustrated to have one dummy pattern portion DP, but the inventive concept is not limited to the number of the dummy pattern portions DP provided in each of the cutting parts 22.

Figure 6:
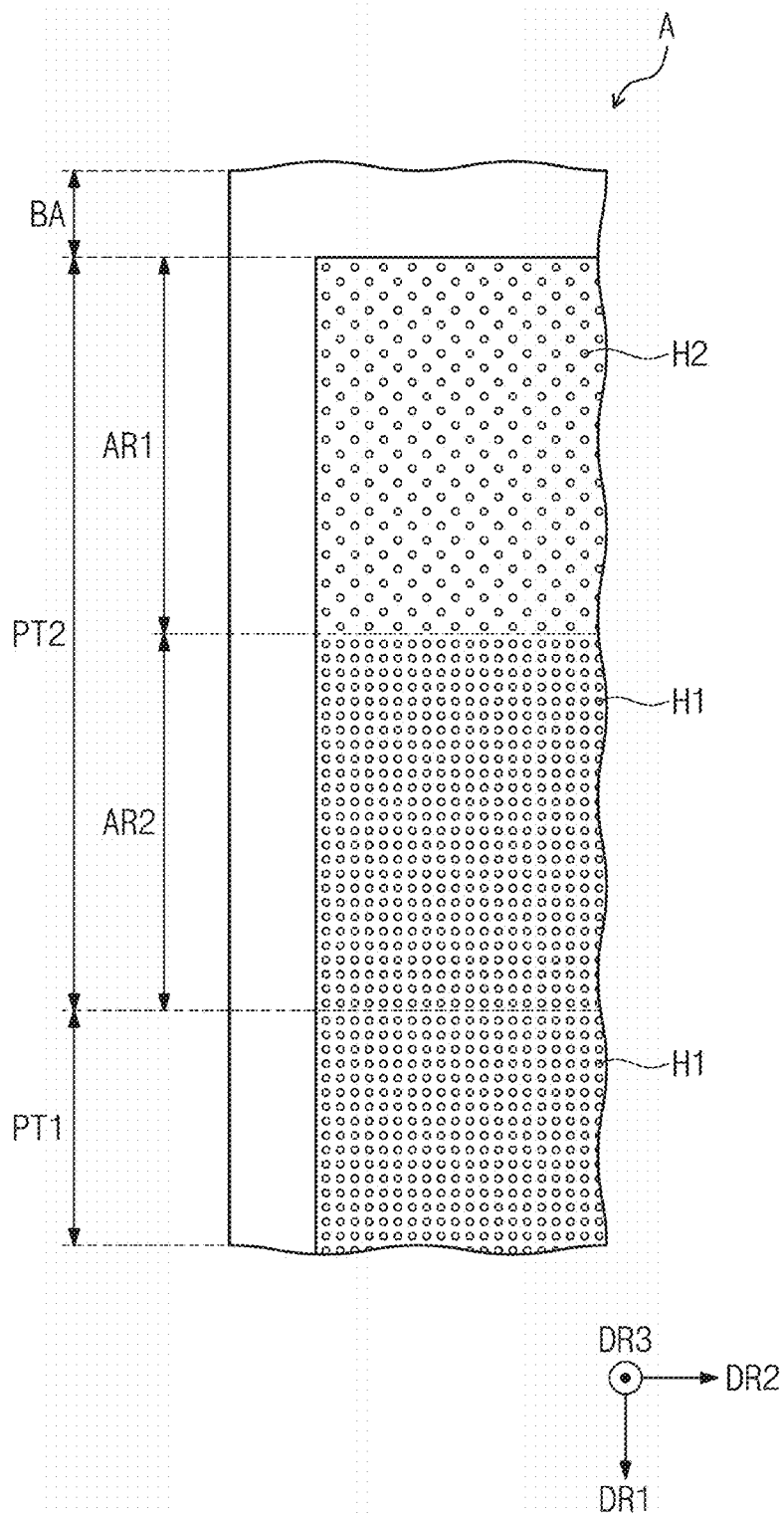
FIG. 6 is an enlarged view illustrating a portion 'A' of FIG. 5.
Figure 7:
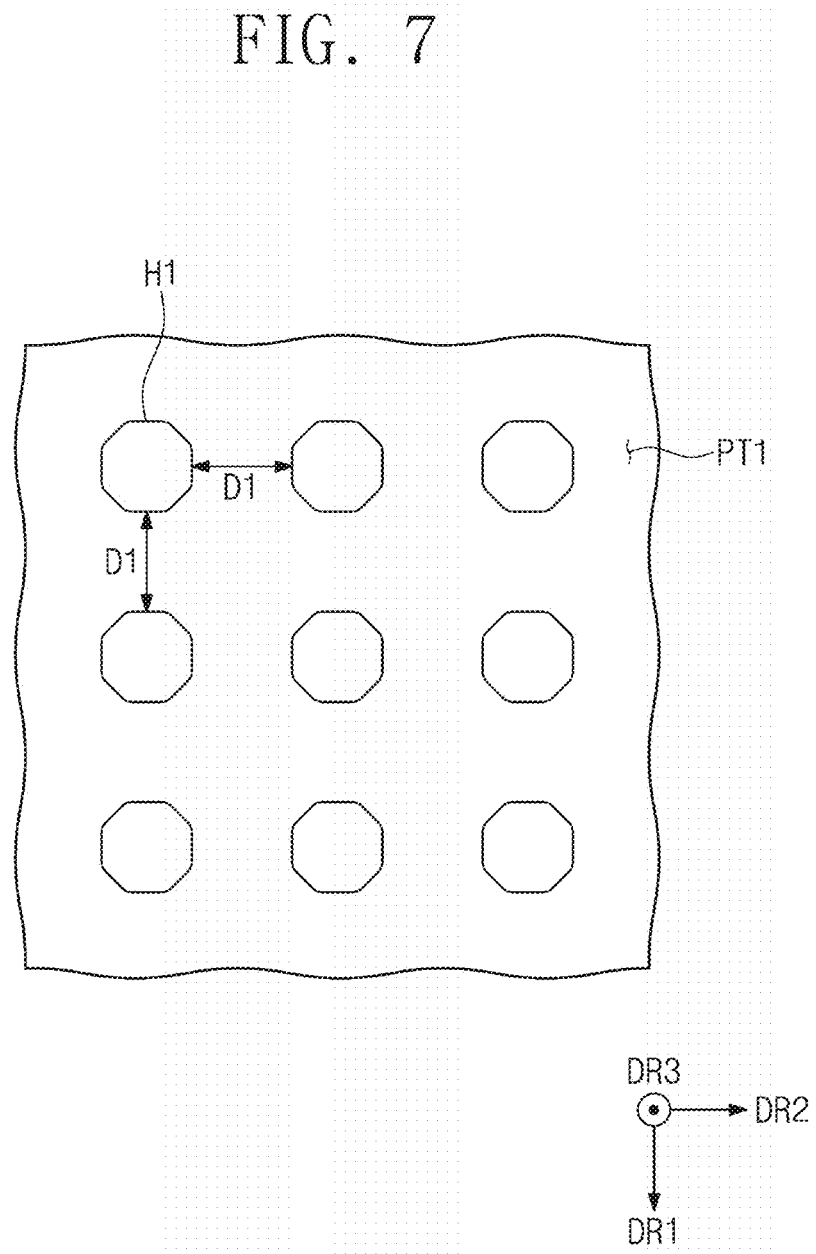
FIG. 7 is an enlarged view illustrating a first pattern portion shown in FIG. 6.
Figure 8:
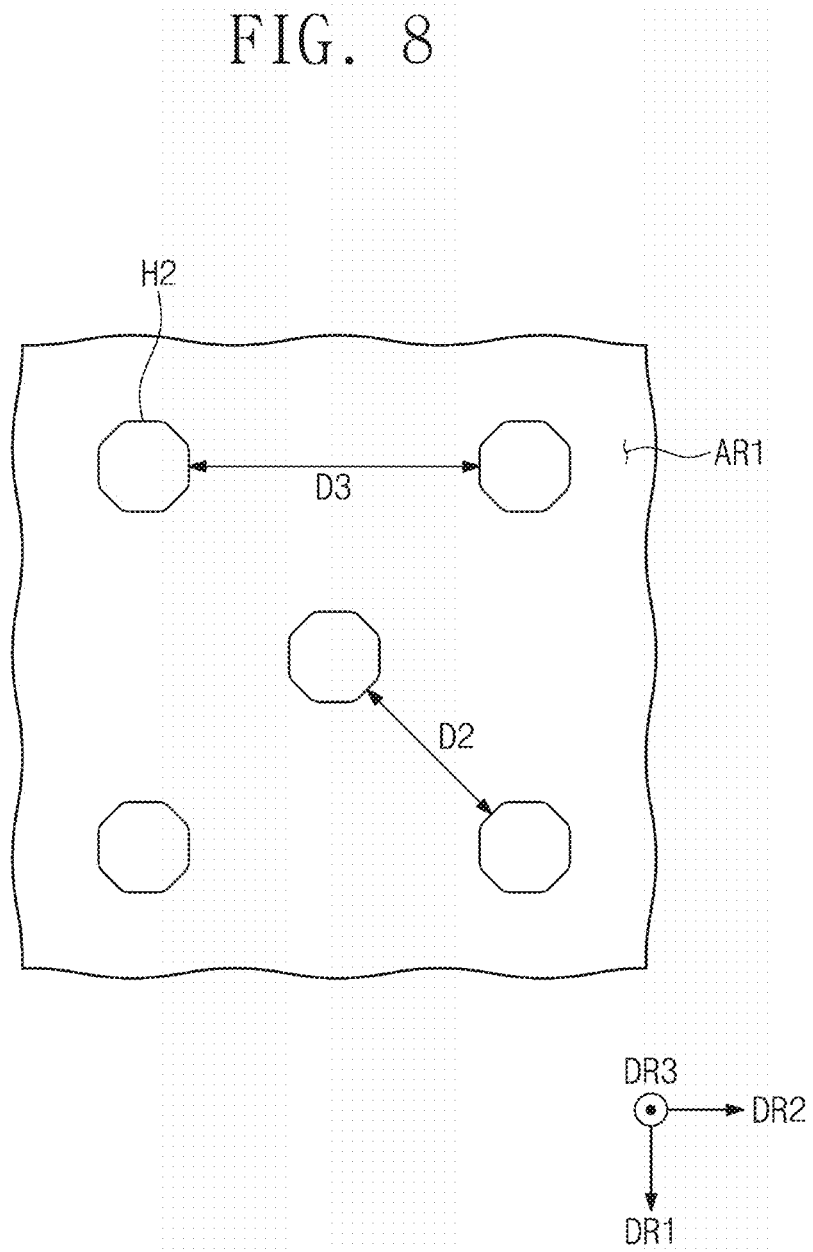
FIG. 8 is an enlarged view illustrating a first portion shown in FIG. 6.

FIG. 6 is an enlarged view illustrating a portion 'A' of FIG. 5. FIG. 7 is an enlarged view illustrating the first pattern portion PT1 shown in FIG. 6. FIG. 8 is an enlarged view illustrating a first portion shown in FIG. 6.

Referring to FIGS. 6 to 8, the first pattern portion PT1 may be provided to have a first opening ratio. For example, a plurality of first pattern holes H1 may be defined in the first pattern portion PT1. The first pattern holes H1 may be arranged in the matrix shape, on a region of the deposition mask 20 occupied by the first pattern portion PT1. A size and a shape of each of the first pattern holes H1 may depend on a size of each cell that will be defined on the target substrate SUB described above. In other words, a designed diameter of each of the first pattern holes H1 may be determined depending on a size of each pattern that will be deposited on the target substrate SUB. In an embodiment, a diameter of each of the first pattern holes H1 may range from about 17 μm to about 22 μm.

As shown in FIG. 7, each of the first pattern holes H1 may have an octagonal shape. However, the shape of each of the first pattern holes H1 may be variously changed (e.g., to one of other polygonal, circular, or elliptical shapes).

The first pattern holes H1 may be arranged to have the first arrangement structure. For example, in such a first arrangement structure, the first pattern holes H1 may be arranged such that the minimum distance between adjacent ones thereof is given as a first distance D1. In the present embodiments, the first distance D1 may range from about 15 μm to about 18 μm.

In the present embodiments, a plurality of second pattern holes H2 may be defined in at least a region of each of the second pattern portions PT2.

For example, each of the second pattern portions PT2 may include a first portion AR1 and a second portion AR2. The first portion AR1 and the second portion AR2 may be arranged in the first direction DR1. The first portion AR1 may be provided outside the second portion AR2 in the first direction DR1. In other words, the first portion AR1 may be provided adjacent to the bonding region BA. The second portion AR2 may be provided between the first portion AR1 and the first pattern portion PT1. In an embodiment, the second portion AR2 may be provided to connect the first portion AR1 to the first pattern portion PT1.

The second portion AR2 may be provided to have a second opening ratio. The second opening ratio may be smaller than the first opening ratio. In detail, a plurality of the second pattern holes H2 may be defined in the first portion AR1. The second pattern holes H2 may be arranged to form a plurality of rows, on a region of the deposition mask 20 occupied by the first portion AR1. A width in the first direction DR1 of the first portion AR1 may be depend on the number of the rows of the second pattern holes H2. In the present embodiments, the second pattern holes H2, which are arranged to form at least two rows, may be defined in the first portion AR1. As shown in FIG. 6, the second pattern holes H2 may be provided to form a plurality of rows arranged in the first direction DR1, and in this case, each of the second pattern holes H2 in even numbered rows may be shifted, in the second direction DR2, from a corresponding one of the second pattern holes H2 in odd numbered rows by a shift distance. Here, the shift distance may be smaller than a distance, in the second direction DR2, between each adjacent pair of the second pattern holes H2, e.g., a third distance D3 in FIG. 8. In an embodiment, the shift distance may be half the third distance D3. A size and a shape of each of the second pattern holes H2 may be equal to a size and a shape of each of the first pattern holes H1.

In the present embodiments, the second pattern holes H2 may be arranged to have a second arrangement structure. In such a second arrangement structure, the second pattern holes H2 may be arranged such that the minimum distance between adjacent ones thereof is given as a second distance D2. In the present embodiments, the second distance D2 may be larger than the first distance D1. For example, the second distance D2 may be larger than or equal to about 20 μm.

A plurality of the first pattern holes H1 may be provided in the second portion AR2. In other words, the first pattern holes H1 in the second portion AR2 may be arranged to have the first arrangement structure. The first pattern holes H1 may be arranged in the matrix shape on a region of the deposition mask 20 occupied by the second portion AR2. In the present embodiments, an opening ratio of the second portion AR2 may be equal to an opening ratio of the first pattern portion PT1. In other words, the minimum distance between the first pattern holes H1 defined in the second portion AR2 may range from about 15 μm to about 18 μm.

In the present embodiments, in each of the first and second portions PT1 and AR2, the largest distance between the first pattern holes H1 may be substantially equal to the second distance D2.

Unlike the afore-described embodiments of the inventive concept, if the pattern portion PT does not include the second pattern portion PT2 (in particular, the first portion AR1 of the second pattern portion PT2), the pattern portion PT having the first opening ratio may be directly connected to the bonding region BA whose opening ratio is 0. In this case, owing to a difference in the opening ratio between the bonding region BA and the pattern portion PT, a stress may be applied to at a boundary region between the bonding region BA and the pattern portion PT, owing to the tensile force from the clamping portion CP. This stress may lead to deformation of the first pattern holes H1, which are defined in a region of the pattern portion PT adjacent to the bonding region BA or misalignment of the deposition mask 20 relative to the frame set 10. By contrast, according to an embodiment of the inventive concept, since the pattern portion PT includes the second pattern portion PT2 having the second opening ratio smaller than the first opening ratio, i.e., the second pattern portion PT2 is placed between the bonding region BA and the first pattern portion PT1, it may be possible to reduce a stress exerted on the boundary region between the bonding region BA and the pattern portion PT.

As a result, in the present embodiments, it may be possible to improve durability of the deposition mask and thereby to improve accuracy and uniformity in the deposition process.

Figure 9:
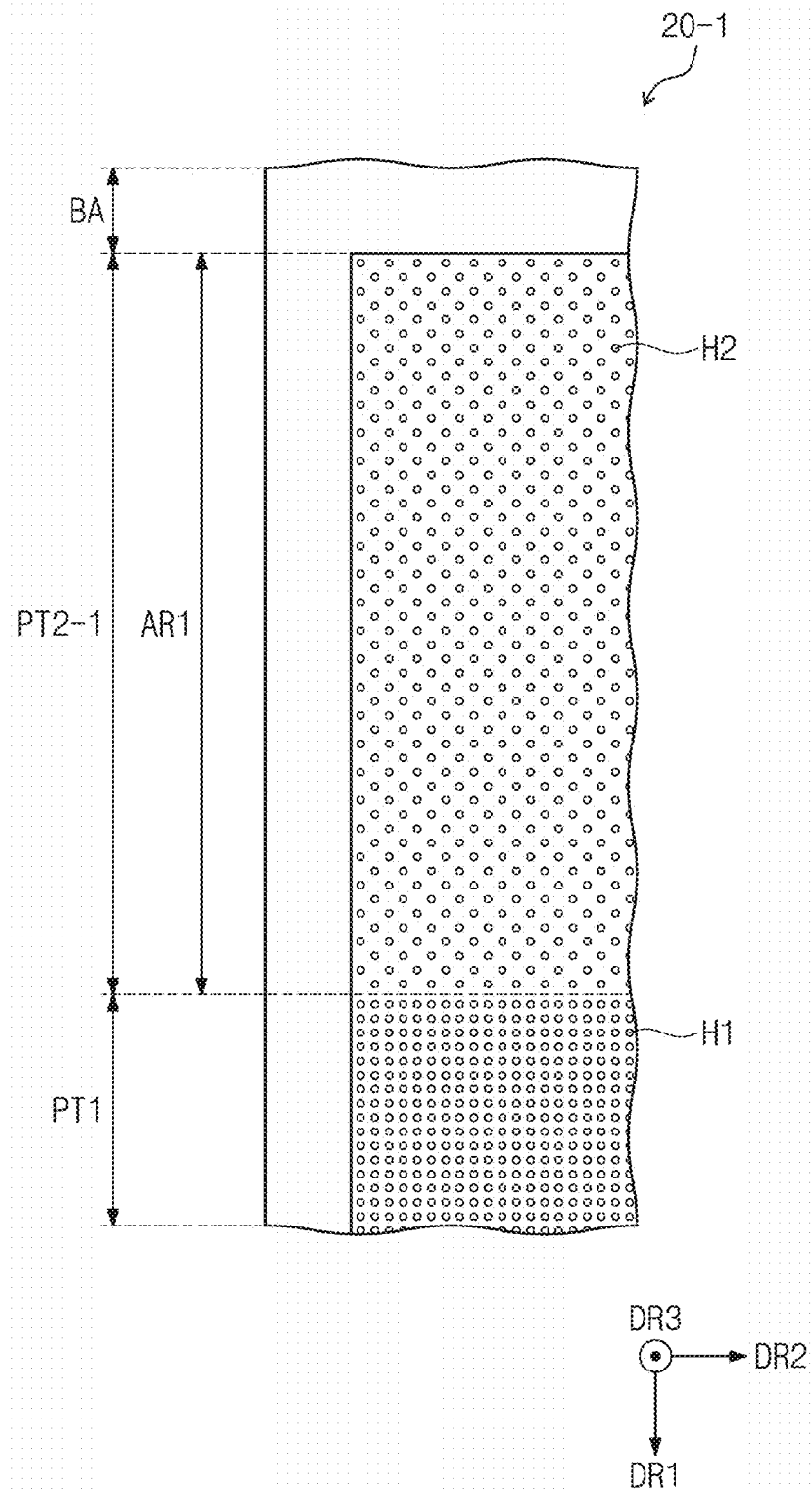
FIG. 9 is an enlarged view illustrating a second pattern portion according to an embodiment of the inventive concept.
Figure 10:
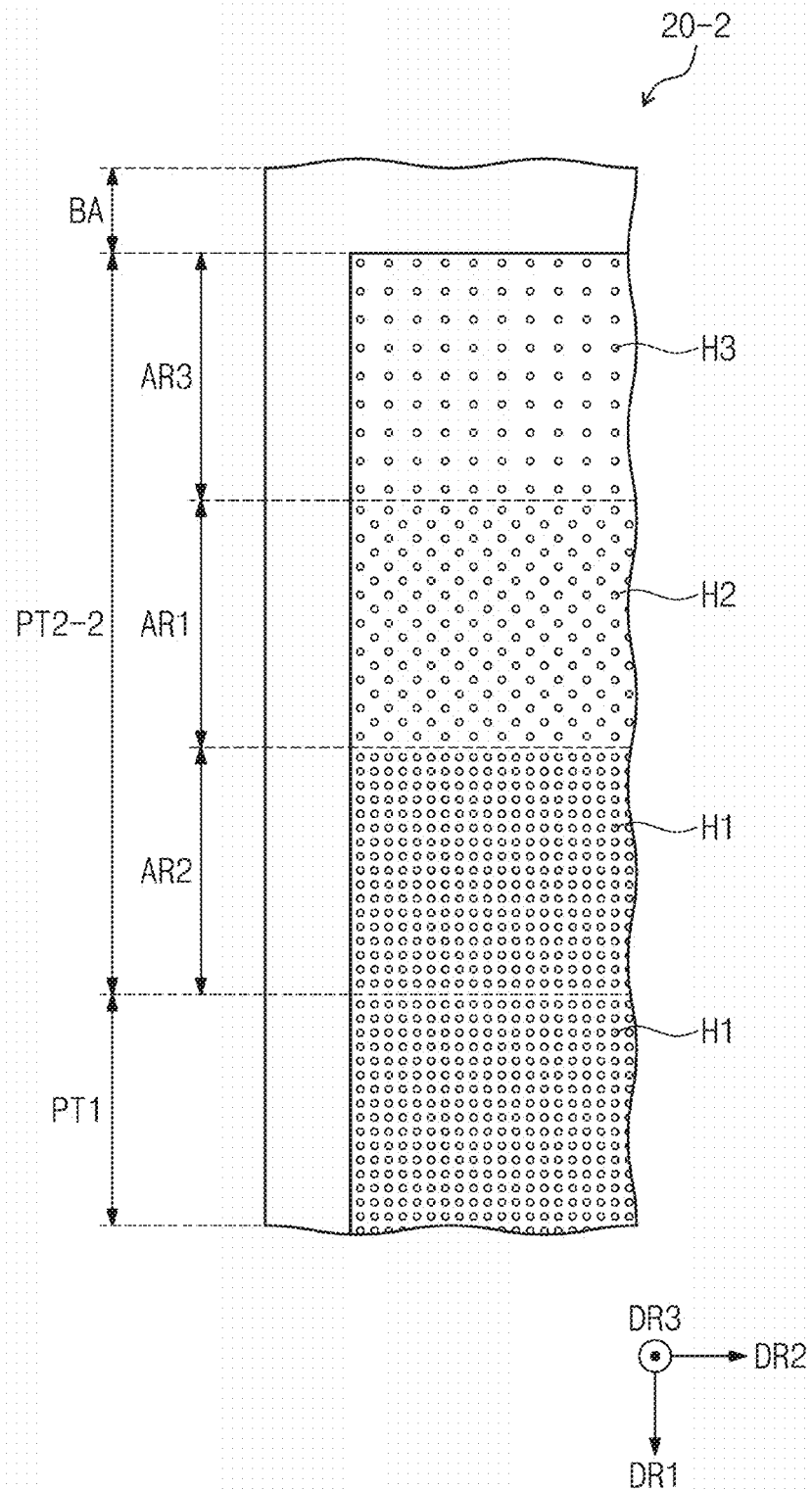
FIG. 10 is an enlarged view illustrating a second pattern portion according to an embodiment of the inventive concept.
Figure 11:
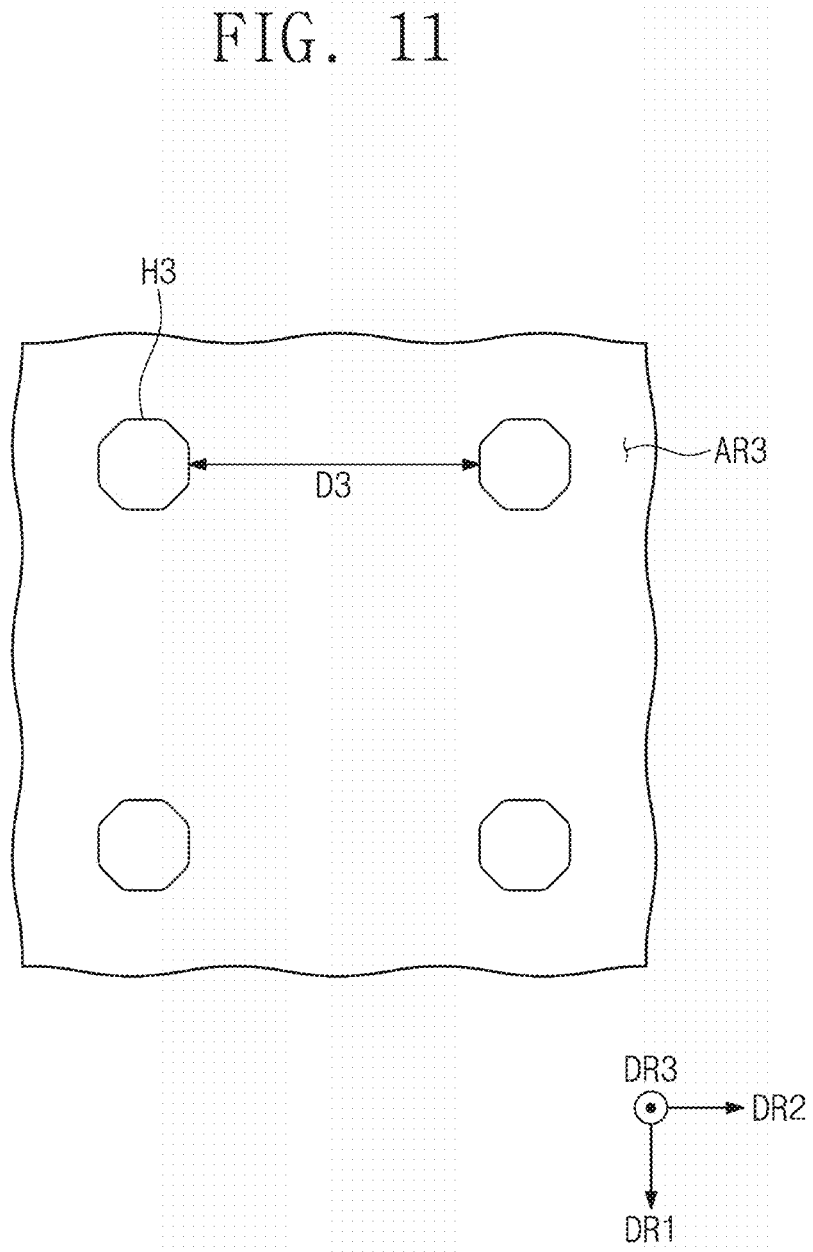
FIG. 11 is an enlarged view illustrating a third portion shown in FIG. 10.

FIGS. 9 and 10 are enlarged views each illustrating a second pattern portion according to an embodiment of the inventive concept. FIG. 11 is an enlarged view illustrating a third portion AR3 shown in FIG. 10.

For concise description, a previously described element may be identified by the same reference number without repeating an overlapping description thereof. Other elements that are not separately described may be configured to have substantially the same technical features as those in the previously described embodiments. Each of FIGS. 9 and 10 illustrates a region corresponding to that shown in FIG. 6.

Referring to FIG. 9, a deposition mask 20-1 according to an embodiment of the inventive concept may include second pattern portions PT2-1, each of which is configured to include only the first portion AR1. In other words, the second portion AR2 described above may not be provided in the second pattern portion PT2-1. The first portion AR1 of the deposition mask 20-1 may be configured to have substantially the same features as those of the first portion AR1 described above, and thus, a detailed description thereof will be omitted.

Referring to FIGS. 10 and 11, each of second pattern portions PT2-2 of a deposition mask 20-2 may further include the third portion AR3. In other words, each of the second pattern portions PT2-2 may include the first, second, and third portions AR1, AR2, and AR3.

In the present embodiments, the third portion AR3 may have a third opening ratio. The third opening ratio may be less than the second opening ratio. In detail, a plurality of third pattern holes H3 may be defined in the third portion AR3. The third pattern holes H3 may be arranged in the matrix shape, on a region of the deposition mask 20-2 occupied by the third portion AR3. A size and a shape of each of the third pattern holes H3 may be substantially equal to a size and a shape of each of the first and second pattern holes H1 and H2.

In the present embodiments, the third pattern holes H3 may be arranged to have a third arrangement structure. In such a third arrangement structure, the third pattern holes H3 may be arrange such that the minimum distance between adjacent ones thereof is given as the third distance D3. In the present embodiments, the third distance D3 may be larger than the second distance D2. For example, the third distance D3 may be larger than about 50 μm. In the present embodiments, it may be possible to more effectively prevent or suppress a stress from being concentrated at a boundary region between the second pattern portion PT2-2 and the bonding region BA.

Figure 12:
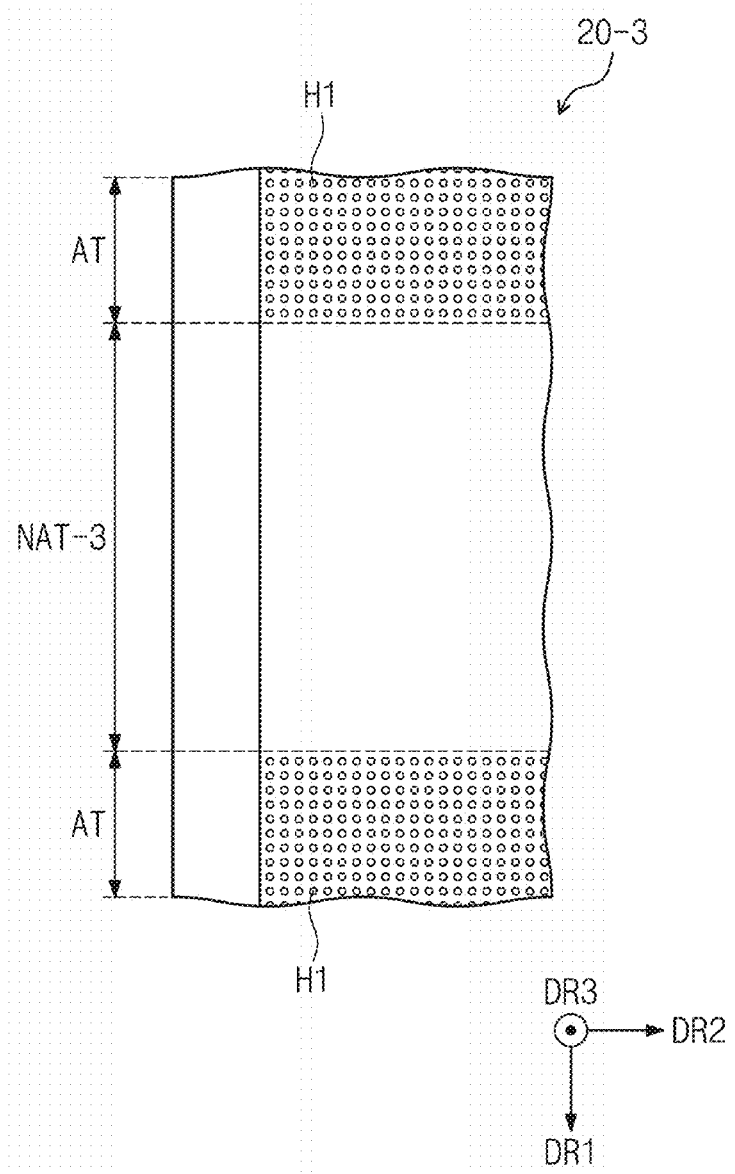
FIG. 12 is an enlarged view illustrating a blocking part according to an embodiment of the inventive concept.
Figure 13:
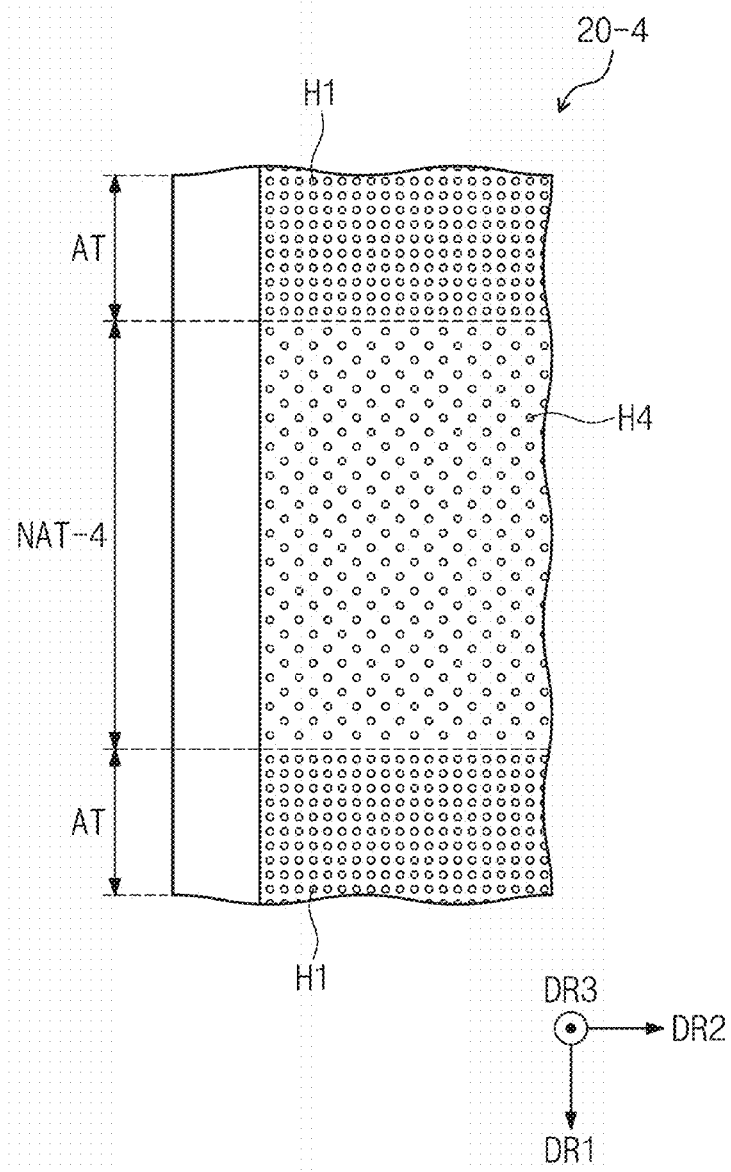
FIG. 13 is an enlarged view illustrating a blocking part according to an embodiment of the inventive concept.
Figure 14:
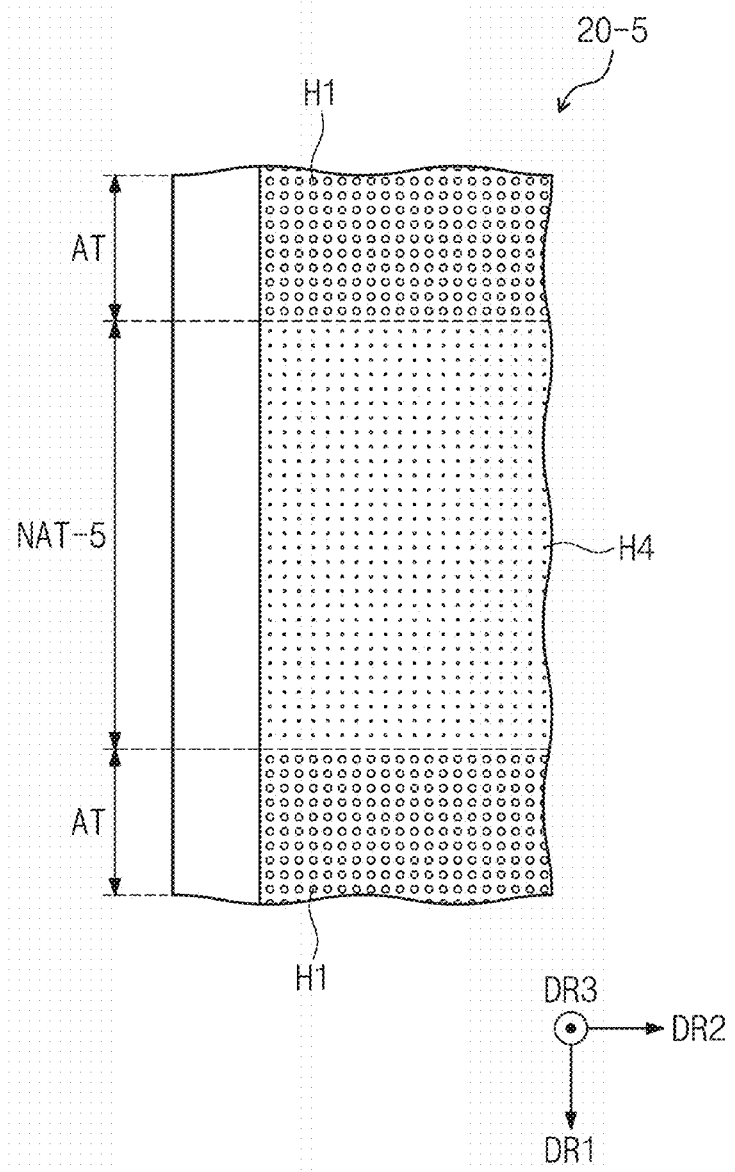
FIG. 14 is an enlarged view illustrating a blocking part according to an embodiment of the inventive concept.

FIGS. 12 to 14 are enlarged views each illustrating a blocking part according to an embodiment of the inventive concept.

For concise description, a previously described element may be identified by the same reference number without repeating an overlapping description thereof. Other elements that are not separately described may be configured to have substantially the same technical features as those in the previously described embodiments. Each of FIGS. 12 to 14 illustrates a region corresponding to the portion 'B' shown in FIG. 5.

Referring to FIGS. 12, 13, and 14, deposition masks 20-3, 20-4, and 20-5 according to some embodiments of the inventive concept may include blocking parts NAT-3, NAT-4, and NAT-5, respectively, each of which is configured to have an opening ratio smaller than an opening ratio of each of the deposition parts AT.

As shown in FIG. 12, there is no pattern hole in the blocking parts NAT-3 of the deposition mask 20-3. In other words, an opening ratio of each of the blocking parts NAT-3 may be 0. Here, each of the deposition parts AT may be provided to have a first opening ratio. In other words, the first pattern holes H1 with the first arrangement structure may be defined in each of the deposition parts AT. The first pattern holes H1 may be configured to have substantially the same features as the first pattern holes H1 in the previously-described embodiments, and a detailed description thereof will be omitted.

In an embodiment, as shown in FIG. 13, each of the blocking parts NAT-4 of the deposition mask 20-4 may have a fourth opening ratio smaller than the first opening ratio. Here, each of the deposition parts AT may have the first opening ratio. For example, a plurality of fourth pattern holes H4 may be provided in each of the blocking parts NAT-4, and the first pattern holes H1 may be provided in each of the deposition parts AT. The first pattern holes H1 may be configured to have substantially the same features as the first pattern holes H1 in the previously-described embodiments, and a detailed description thereof will be omitted.

The fourth pattern holes H4 may be arranged to form a plurality of rows, on a region of the deposition mask 20-4 occupied by each of the blocking parts NAT-4. The rows of the fourth pattern holes H4 may be arranged in the first direction DR1, and in this case, the fourth pattern holes H4 in two adjacent rows may be alternately arranged with respect to each other in the second direction DR2. In the present embodiments, a size and a shape of each of the fourth pattern holes H4 may be the same as those of each of the first to third pattern holes H1-H3.

The fourth pattern holes H4 may be arranged to have a fourth arrangement structure. In such a fourth arrangement structure, the fourth pattern holes H4 may be arranged such that the minimum distance between adjacent ones thereof is given as a fourth distance (not shown). In the present embodiments, the fourth distance may be larger than the first distance D1. For example, the fourth distance may be larger than or equal to the second distance D2. In other words, the fourth distance may be larger than or equal to about 20 μm.

In an embodiment, as shown in FIG. 14, each of the blocking parts NAT-5 of a deposition mask 20-5 may have a fourth opening ratio smaller than the first opening ratio. For example, a plurality of the fourth pattern holes H4 may be provided in each of the blocking parts NAT-5, and the first pattern holes H1 may be provided in each of the deposition parts AT. The first pattern holes H1 may be configured to have substantially the same features as the first pattern holes H1 in the previously-described embodiments, and a detailed description thereof will be omitted.

The fourth pattern holes H4 may be arranged in the matrix shape, on a region of the deposition mask 20-5 occupied by each of the blocking parts NAT-4. In the present embodiments, a size of each of the fourth pattern holes H4 may be smaller than a size of each of the first to third pattern holes H1 to H3. Furthermore, the minimum distance between adjacent ones of the fourth pattern holes H4 may be substantially equal to the first distance D1 (e.g., see FIG. 6).

According to an embodiment of the inventive concept, it may be possible to improve accuracy and uniformity in a deposition process.

While example embodiments of the inventive concept have been particularly shown and described, it will be understood by one of ordinary skill in the art that variations in form and detail may be made therein without departing from the spirit and scope of the attached claims.

What is claimed is:

1. A deposition mask, comprising:
a patterning region provided with a pattern portion; and
a plurality of bonding regions provided near opposite ends of the patterning region in a first direction,
wherein the pattern portion comprises:
a first pattern portion, in which first pattern holes are defined; and
a plurality of second pattern portions, in which second pattern holes are defined, and which are located between opposite ends of the first pattern portion and the bonding regions in the first direction, the second pattern holes forming a plurality of rows arranged in the first direction, each of the second pattern holes in even numbered rows being shifted in a second direction from a corresponding one of the second pattern holes in odd numbered rows,
wherein a second distance, which is a minimum distance between adjacent ones of the second pattern holes, is larger than a first distance, which is a minimum distance between adjacent ones of the first pattern holes.

2. The deposition mask of claim 1, wherein a size of each of the first pattern holes is substantially equal to a size of each of the second pattern holes.

3. The deposition mask of claim 1, wherein the second distance is larger than or equal to about 20 μm.

4. The deposition mask of claim 1, wherein each of the second pattern portions comprises:
a first portion, which is provided adjacent to a bonding region of the bonding regions, and in which the second pattern holes are defined; and
a second portion, which is provided between the first portion and the first pattern portion, and in which the first pattern holes are defined.

5. The deposition mask of claim 4, wherein, in the first portion, the second pattern holes are defined to form at least two rows.

6. A deposition mask, comprising:
a patterning region provided with a pattern portion; and
a plurality of bonding regions provided near opposite ends of the patterning region in a first direction,
wherein the pattern portion comprises:
a first pattern portion, in which first pattern holes are defined; and
a plurality of second pattern portions, in which second pattern holes are defined, and which are located between opposite ends of the first pattern portion and the bonding regions in the first direction,
wherein a second distance, which is a minimum distance between adjacent ones of the second pattern holes, is larger than a first distance, which is a minimum distance between adjacent ones of the first pattern holes,
wherein each of the second pattern portions comprises:
a first portion, which is provided adjacent to a bonding region of the bonding regions, and in which the second pattern holes are defined;
a second portion, which is provided between the first portion and the first pattern portion, and in which the first pattern holes are defined; and
a third portion, which is provided between the first portion and the bonding region, and in which third pattern holes are defined,
wherein a third distance, which is a minimum distance between adjacent ones of the third pattern holes, is larger than the second distance.

7. The deposition mask of claim 1, wherein the first pattern portion comprises:
a plurality of deposition parts, which are spaced apart from each other in the first direction, and in which the first pattern holes are defined; and
at least one blocking part provided between the deposition parts.

8. The deposition mask of claim 7, wherein there are no holes in the blocking part.

9. The deposition mask of claim 7, wherein a plurality of fourth pattern holes are defined in the blocking part, and
a size of each of the fourth pattern holes is substantially equal to a size of each of the first pattern holes.

10. The deposition mask of claim 9, wherein a minimum distance between adjacent ones of the fourth pattern holes is larger than or equal to the second distance.

11. A deposition mask, comprising:
a patterning region provided with a pattern portion; and
a plurality of bonding regions provided near opposite ends of the patterning region in a first direction,
wherein the pattern portion comprises:
a first pattern portion, in which first pattern holes are defined; and
a plurality of second pattern portions, in which second pattern holes are defined, and which are located between opposite ends of the first pattern portion and the bonding regions in the first direction,
wherein a second distance, which is a minimum distance between adjacent ones of the second pattern holes, is larger than a first distance, which is a minimum distance between adjacent ones of the first pattern holes,
wherein the first pattern portion comprises:
a plurality of deposition parts, which are spaced apart from each other in the first direction, and in which the first pattern holes are defined; and
at least one blocking part provided between the deposition parts, wherein a plurality of fourth pattern holes are defined in the blocking part, and a size of each of the fourth pattern holes is less than a size of each of the first pattern holes.

12. The deposition mask of claim 11, wherein a minimum distance between adjacent ones of the fourth pattern holes is substantially equal to the first distance.

13. The deposition mask of claim 7, wherein a width of the blocking part in the first direction is different than a width of the second pattern portions in the first direction.

14. The deposition mask of claim 1, wherein a largest distance between the first pattern holes is substantially equal to the second distance.

15. The deposition mask of claim 1, further comprising cutting parts, which are provided adjacent to opposite ends of the bonding regions in the first direction,
wherein each of the cutting parts comprises a dummy pattern portion, in which dummy pattern holes are defined, and
the dummy pattern holes are defined to have substantially a same arrangement structure as that of the first pattern holes.

16. The deposition mask of claim 15, wherein a clamping recess is defined at each of the cutting parts, which is recessed inward from an outer side of the cutting parts in the first direction.

17. A mask assembly, comprising:
a frame set; and
a plurality of deposition masks disposed on the frame set, each of the plurality of deposition masks extending in a first direction,
wherein the frame set comprises:
a support frame; and
a plurality of support bars, which extend in a second direction crossing the first direction and are arranged in the first direction, opposite ends of each of the plurality of support bars in the second direction being coupled to the support frame,
wherein each of the deposition masks comprises:
a plurality of bonding regions, which are spaced apart from each other in the first direction and are fixed to the support frame; and
a patterning region, which is provided between the bonding regions and in which a pattern portion is disposed,
wherein the pattern portion comprises:
a first pattern portion, which is provided to overlap a center of the pattern portion, and in which a plurality of first pattern holes are defined; and
a plurality of second pattern portions, which are provided between opposite ends of the first pattern portion and the bonding regions in the first direction, a plurality of second pattern holes being defined in at least a region of each of the plurality of second pattern portions, the second pattern holes forming a plurality of rows arranged in the first direction, each of the second pattern holes in even numbered rows being shifted in the second direction from a corresponding one of the second pattern holes in odd numbered rows,
wherein a minimum distance between adjacent ones of the second pattern holes is larger than a minimum distance between adjacent ones of the first pattern holes.

18. The mask assembly of claim 17, wherein a size of each of the first pattern holes is substantially equal to a size of each of the second pattern holes.

19. The mask assembly of claim 17, wherein the support bars comprise:
at least one first support bar arranged in the first direction and overlapping a portion of the first pattern portion; and
second support bars, which are the outermost ones of the support bars in the first direction and are overlapping the second pattern portions of each of the deposition masks.

20. The mask assembly of claim 19, wherein the first pattern portion comprises:
a plurality of deposition parts, which are spaced apart from each other in the first direction, and in which the first pattern holes are defined; and
at least one blocking part, which is provided between the deposition parts and is overlapping the first support bar.

21. The mask assembly of claim 19, wherein a width of each of the second support bars in the first direction is different than a width of each of the first support bars in the first direction.

22. The mask assembly of claim 17, wherein there are no holes in the bonding regions.

23. The mask assembly of claim 17, wherein each of inner side portions of the support frame, which are opposite to each other in the second direction, is provided to have a plurality of coupling pockets arranged in the first direction, and
opposite ends of the support bars are disposed in the plurality of coupling pockets.

24. The mask assembly of claim 17, wherein the minimum distance between adjacent ones of the second pattern holes is larger than or equal to about 20 μm.

25. The mask assembly of claim 17, wherein, in the second pattern portions, the second pattern holes form at least two rows.

26. A deposition mask, comprising:
a patterning region, in which a plurality of pattern holes are defined; and
a plurality of bonding regions provided near opposite ends of the patterning region in a first direction,
wherein a minimum distance between adjacent ones of the pattern holes, which are defined in portions of the patterning region adjacent to the bonding regions, is larger than a minimum distance between adjacent ones of the pattern holes, which are defined in another portion of the patterning region other than the portions, the pattern holes in the portions forming a plurality of rows arranged in the first direction, each of the pattern holes in even numbered rows being shifted in a second direction from a corresponding one of the pattern holes in odd numbered rows.

27. A deposition mask, comprising:
a patterning region including a pattern portion; and
a plurality of bonding regions provided near opposite ends of the patterning region in a first direction,
wherein the pattern portion comprises:
a first pattern portion, in which pattern holes in a first arrangement structure are defined; and
a plurality of second pattern portions, pattern holes in a second arrangement structure being defined in at least a portion of the plurality of second pattern portions,
wherein a minimum distance between the pattern holes in the second arrangement structure is larger than a minimum distance between the pattern holes in the first arrangement structure, the pattern holes in the second arrangement structure forming a plurality of rows arranged in the first direction, each of the pattern holes in even numbered rows being shifted in a second direction from a corresponding one of the pattern holes in odd numbered rows.

28. The deposition mask of claim 27, wherein the minimum distance between the pattern holes in the second arrangement structure is larger than or equal to about 20 µm.

29. The deposition mask of claim 27, wherein a diameter of each of the pattern holes in the first and second arrangement structures ranges from about 17 µm to about 22 µm.

30. The deposition mask of claim 27, wherein the pattern holes in the second arrangement structure form at least two rows.

\* \* \* \* \*